US008446164B2

(12) United States Patent
Chang et al.

(10) Patent No.: US 8,446,164 B2
(45) Date of Patent: May 21, 2013

(54) SEMICONDUCTOR DEVICE TEST SYSTEM HAVING HIGH FIDELITY TESTER ACCESS FIXTURE (HIFIX) BOARD

(75) Inventors: Kyung-hun Chang, Yongin-si (KR); Se-kyung Oh, Seongnam-si (KR); Eung-sang Lee, Seongnam-si (KR)

(73) Assignee: International Trading & Technology Co., Ltd. (KR)

( * ) Notice: Subject to any disclaimer, the term of this patent is extended or adjusted under 35 U.S.C. 154(b) by 395 days.

(21) Appl. No.: 12/747,267

(22) PCT Filed: Oct. 17, 2008

(86) PCT No.: PCT/KR2008/006160
§ 371 (c)(1),
(2), (4) Date: Sep. 21, 2010

(87) PCT Pub. No.: WO2009/075469
PCT Pub. Date: Jun. 18, 2009

(65) Prior Publication Data
US 2011/0018572 A1 Jan. 27, 2011

(30) Foreign Application Priority Data
Dec. 10, 2007 (KR) .................. 10-2007-0127703

(51) Int. Cl.
*G01R 31/26* (2006.01)
(52) U.S. Cl.
USPC ............. 324/762.01; 324/756.04; 324/756.07
(58) Field of Classification Search
None
See application file for complete search history.

(56) References Cited

U.S. PATENT DOCUMENTS

| | | | | |
|---|---|---|---|---|
| 6,133,725 | A | * | 10/2000 | Bowhers .................. 324/750.01 |
| 6,710,590 | B1 | | 3/2004 | Markert et al. |
| 2003/0208711 | A1 | * | 11/2003 | Frame et al. .................. 714/742 |
| 2006/0270357 | A1 | * | 11/2006 | Puente et al. .............. 455/67.11 |
| 2007/0205790 | A1 | * | 9/2007 | Ezoe .............................. 324/765 |

FOREIGN PATENT DOCUMENTS

| | | |
|---|---|---|
| EP | 1612571 | 1/2006 |
| JP | 2002-005999 | 1/2002 |
| JP | 2002-071755 | 3/2002 |
| JP | 2002-357640 | 12/2002 |
| TW | 200525130 | 8/2005 |
| WO | 2007007658 | 1/2007 |

OTHER PUBLICATIONS

International Search Report—PCT/KR2008/006160 dated Apr. 17, 2009.
Written Opinion—PCT/KR2008/006160 dated Apr. 17, 2009.
Taiwanese Office Action—Taiwanese Application No. 097146062 issued on Jul. 10, 2012, citing WO2007/007658, TW200525130, EP1612571 and US6710590.

* cited by examiner

*Primary Examiner* — Minh N Tang
(74) *Attorney, Agent, or Firm* — Cantor Colburn LLP

(57) ABSTRACT

A semiconductor device test system is disclosed. The semiconductor device test system extends driver- and comparator-functions acting as important functions of a test header to an external part (e.g., a HIFIX board) of the test header, such that it can double the productivity of a test without upgrading the test header. The semiconductor device test system includes a test header for testing a semiconductor device by a test controller, and a HIFIX board for establishing an electrical connection between the semiconductor device and the test header, and including a Device Under Test (DUT) test unit which processes a read signal generated from the semiconductor device by making one pair with a driver of the test header and transmits the processed read signal to the test header.

4 Claims, 3 Drawing Sheets

SEMICONDUCTOR DEVICE TEST SYSTEM HAVING HIGH FIDELITY TESTER ACCESS FIXTURE (HIFIX) BOARD

BACKGROUND OF THE INVENTION

1. Field of the Invention

The present invention relates to a semiconductor device test system, and more particularly to a semiconductor device test system which extends driver- and comparator-functions acting as important functions of a test header to an external part (e.g., a HIFIX board) of the test header, such that it can double the productivity of a test without upgrading the test header.

2. Description of the Related Art

As well known in the art, a semiconductor device manufactured by a predetermined assembly process or a semiconductor fabrication process experiences a test process for determining whether or not a specific function is finally carried out.

FIG. 1 is a perspective view illustrating a conventional system for testing a semiconductor device. Referring to FIG. 1, the conventional system for testing the semiconductor device includes a test header 2, a handler 3, and a High Fidelity Tester Access Fixture board (HIFIX board) 1. The test header 2 tests a semiconductor device. The handler 3 carries a predetermined number of semiconductor devices, performs a desired test on the semiconductor devices, classifies the semiconductor devices according to their grades, and loads the classified semiconductor devices thereon. The HIFIX board 1 is located between the test header 2 and the handler 3, such that it establishes an electrical connection between the semiconductor device and the test header 2. In other words, if the semiconductor seated in an insert on a test tray is brought into contact with sockets of an (m×n) matrix on the HIFIX board 1 on the condition that the HIFIX board 1 having the sockets of the (m×n) matrix is matched with a test site of the handler 3, the conventional semiconductor test system can simultaneously test (m×n) semiconductor devices.

The HIFIX board is a board used in the process of testing semiconductor products. The HIFIX board comprises a component (connector, pogo pin block) for transmitting an electric signal that is approved from a tester; a PCB for configuring a circuit; a socket for which a device is loaded; a socket guide; a handler; a tester; and an equipment for docking, etc.

FIG. 2 is a block diagram illustrating a conventional semiconductor test header apparatus.

Referring to FIG. 2, the test header2 includes a single test header substrate and a variety of circuit elements mounted on one or both sides of the test header substrate. This test header substrate includes an ALgorithm Pattern Generator (ALPG) 21, a Pin Electronic (PE) unit (not shown), a digital comparator 23, and an interface unit (not shown).

The algorithm pattern generator (ALPG) 21 generates a predetermined test pattern signal for testing the semiconductor. The pin electronic (PE) unit includes: a driver 25 for recording the test pattern signal generated from the algorithm pattern generator (ALPG) 21 in a semiconductor device called a Device Under Test (DUT) 30; and a comparator 27 for comparing a read signal of the test pattern read by the DUT 30 with a reference signal corresponding to characteristics of the corresponding semiconductor and outputting the result of the comparison. The digital comparator 23 determines whether or not there is a failure in the output signal of the pin electronic (PE) unit. The interface unit interfaces with a test controller 10 controlling the semiconductor test system.

In more detail, the pin electronic (PE) unit is a circuit for directly applying current and voltage signals based on test patterns to the semiconductor contained in the DUT 30, such that it forms a single input/output (I/O) channel If the algorithm pattern generator (ALPG) 21 generates the test pattern signal, the driver 25 contained in the PE unit records a corresponding test pattern signal in a test-objective semiconductor contained in the Ball Grid Array (BGA)-type DUT 30. The recorded pattern signal is read by the DUT 30, such that the read pattern signal is outputted to the comparator 27. The comparator 27 transmits a comparison resultant signal indicating the comparison result between the read signal of the test pattern and the reference signal to the digital comparator 23. The digital comparator 23 determines whether or not there is a failure of the corresponding read signal, and transmits the determined result to a test controller 10.

However, in the conventional semiconductor device test system, the handler generally requests a large number of DUTs at once. In recent times, an improved handler capable of simultaneously handling 512 DUTs has been developed and come onto the market, such that a test header for the improved handler must be upgraded. However, a device required for upgrading the above-mentioned test header is very expensive, so that the conventional semiconductor device test system has difficulty in upgrading the test header, and also has difficulty in increasing the productivity.

Needless to say, although the conventional semiconductor device test system can establish a connection between the test header (e.g., a 256-parallel test header) and the handler (e.g., 512-parallel handler) by segmenting one I/O channel into two I/O channels, it takes a long period of time to read the read signals outputted from the DUT as many as the number of segmentations from the test header, resulting in an increased total test time. That is, although the handler of the conventional semiconductor device test system is upgraded such that the improved semiconductor device test system is configured, there is no or little difference in productivity between the conventional semiconductor device test system and the improved semiconductor device test system.

SUMMARY OF THE INVENTION

Accordingly, the present invention is directed to a semiconductor device test system that substantially obviates one or more problems due to limitations and disadvantages of the related art.

It is an object of the present invention to provide a semiconductor device test system which enables a read signal generated from a DUT to be processed by not a test header but an external device (preferably, a HIFIX board) installed between the DUT and the test header such that the external device has the same performance as that of a handler, thereby doubling the productivity of a test without upgrading the test header.

In accordance with one aspect of the present invention, the above and other objects can be accomplished by the provision of a semiconductor device test system comprising: a test header for testing a semiconductor device by a test controller; and a HIFIX board for establishing an electrical connection between the semiconductor device and the test header, and including a Device Under Test (DUT) test unit which processes a read signal generated from the semiconductor device by making one pair with a driver of the test header and transmits the processed read signal to the test header.

The DUT test unit may include: a plurality of pin electronic (PE) units, each of which includes a HIFIX-side driver for recording a pattern signal received from the test header in the semiconductor device, and a HIFIX-side comparator for comparing the read signal generated from the semiconductor device with a reference signal received from the test header and outputting the result of comparison between the read signal and the reference signal; a plurality of digital comparators which correspond to the plurality of pin electronic (PE)

units, respectively, determines whether or not there is a failure in the output signal of the HIFIX-side comparator and stores the determined result; a bundle of switches for turning on or off a connection between the test header and the plurality of pin electronic (PE) units; and a switch driver for driving the bundle of switches.

The switch driver may be controlled by the test header.

The HIFIX-side driver may be controlled by the test header.

The DUT test unit may be implemented with an application specific integrated circuit or a field-programmable gate array (FPGA).

It is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1:
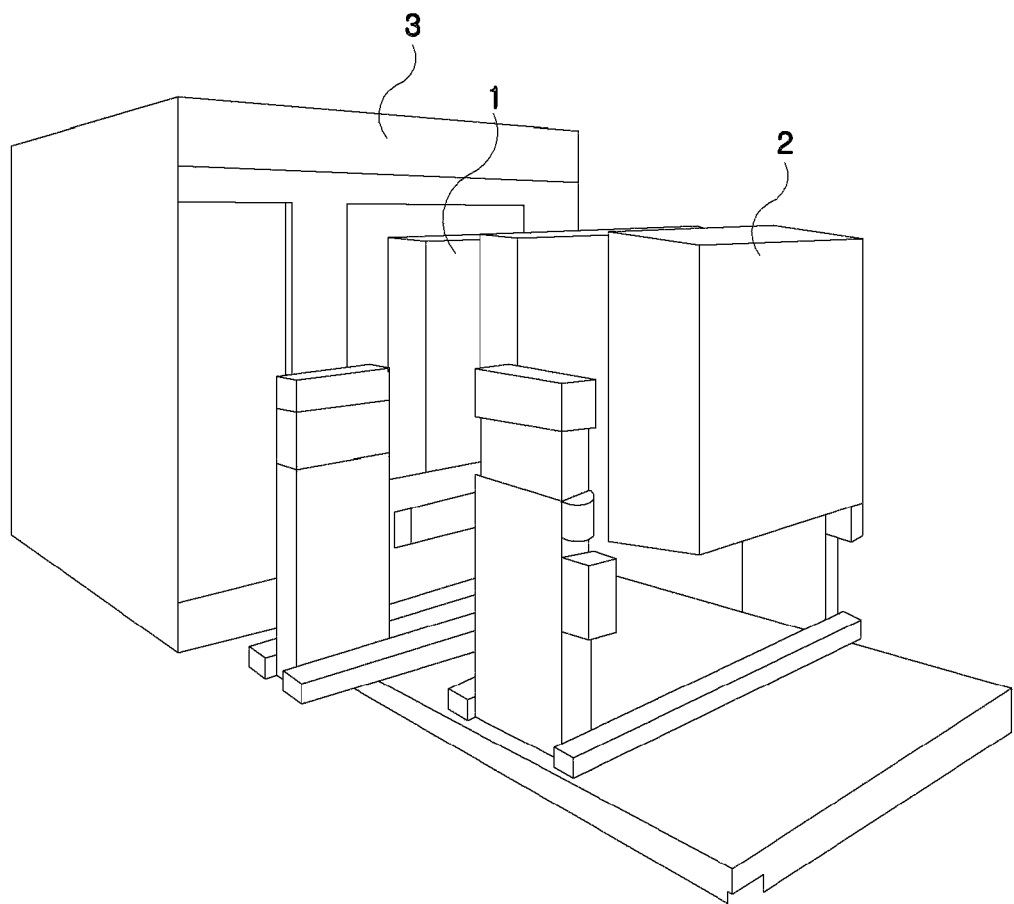
FIG. 1 is a perspective view illustrating a conventional semiconductor device test system.
Figure 2:
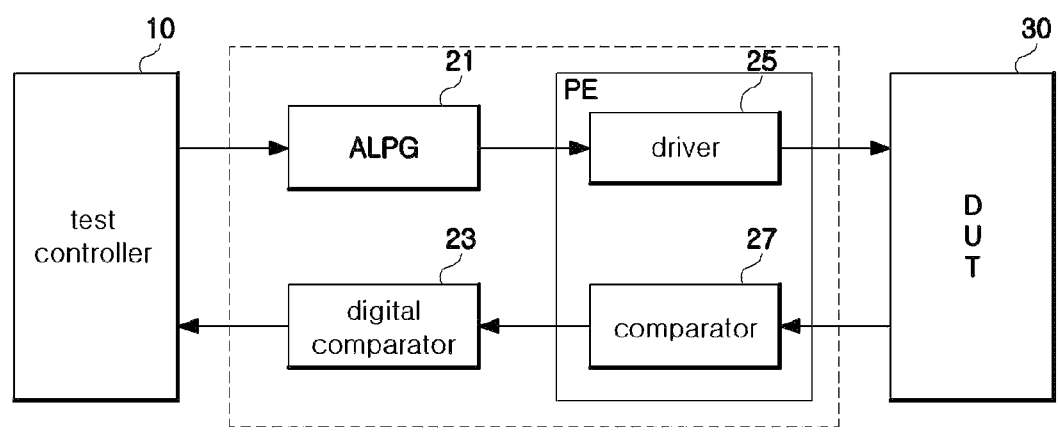
FIG. 2 is a block diagram illustrating a conventional semiconductor test header apparatus.

Now, certain or exemplary embodiments of the present invention will be described in detail with reference to the annexed drawings. In the drawings, the same or similar elements are denoted by the same reference numerals even though they are depicted in different drawings. In the following description, a detailed description of known functions and configurations incorporated herein will be omitted when it may make the subject matter of the present invention rather unclear.

A semiconductor device test system according to the present invention will hereinafter be described with reference to the annexed drawings.

Figure 3:
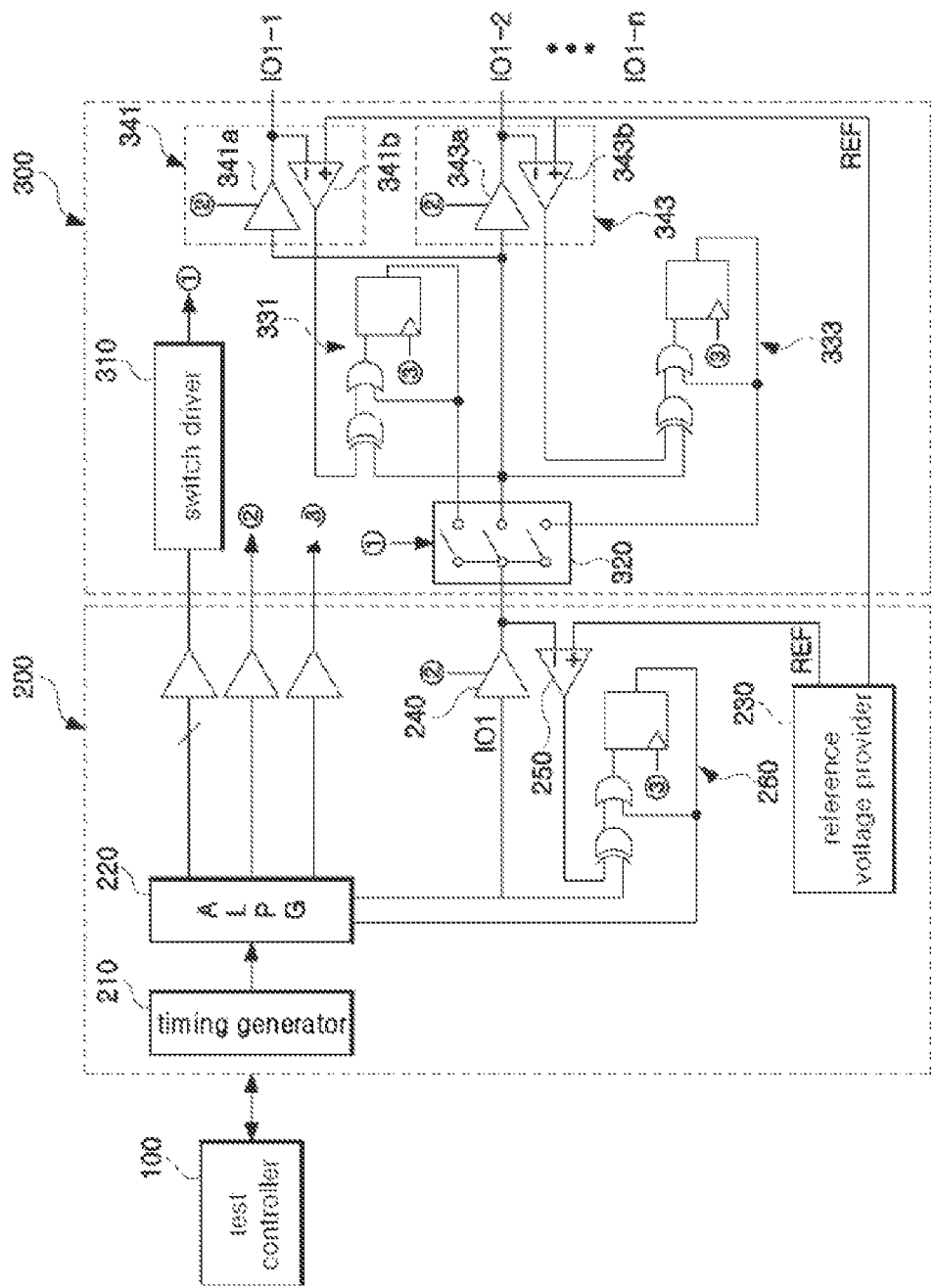
FIG. 3 is an electrical block diagram illustrating a semiconductor device test system according to the present invention.

FIG. 3 is an electrical block diagram illustrating a semiconductor device test system according to the present invention.

Referring to FIG. 3, the semiconductor device test system according to the present invention generally includes a test controller 100, a test header 200, a handler (not shown), and a HIFIX board 300. The test header 200 tests a DUT upon receiving a control signal from the test controller 100. The handler carries a predetermined number of DUTs, performs a desired test on the DUTs, classifies the DUTs according to their grades by referring to the test result, and loads the classified DUTs thereon. The HIFIX board 300 is located between the test header 200 and the handler to establish an electrical connection between each DUT and the test header 200, processes the read signal generated from the DUT upon receiving a control signal from the test header 200, and transmits the processed result to the test header 200.

In the above-mentioned construction, the test header 200 includes a timing generator 210, an algorithm pattern generator (ALPG) 220, a pin electronic (PE) unit, a digital comparator 260, and a reference voltage provider 230.

The timing generator 210 generates a variety of timing signals requested by the system upon receiving a control signal from the test controller 100. The ALPG 220 generates a variety of algorithm patterns according to the timing signal generated from the timing generator 210. The pin electronic (PE) unit includes a driver 240 for recording a test pattern signal generated from the ALPG 220 in a Device Under Test (DUT), and a comparator 250 for comparing a read signal of the test pattern read by the DUT with a reference signal corresponding to characteristics of a corresponding semiconductor and comparing the result of comparison between the read signal and the reference signal. The digital comparator 260 determines whether or not there is a failure in the output signal of the comparator 250 of the pin electronic (PE) unit. The reference voltage provider 230 transmits a reference signal (i.e., a reference voltage) corresponding to the read signal generated from the DUT to the comparator 250 and the HIFIX board 300. In this case, the ALPG 220 outputs a control signal required for processing the read signal generated from the DUT upon receiving a control signal from the test controller 100.

In this case, the test header 200 may further include a time delay element for compensating a time delay between the drivers 240, a DC parameter measurement unit for measuring a variety of DC parameters concerned with the DUT. For example, the DC parameter measurement unit may be a current load for testing an output voltage or output current of the DUT, and/or a high-precision DC measurement circuit, acting as a programmable measurement unit (PMU), for measuring a current value (i.e., VFIM operation) by applying a voltage signal to the DUT or measuring a voltage value by applying the current signal to the DUT.

Next, the HIFIX board 300 includes sockets of an (m×n) matrix. In other words, if the DUT seated in an insert on a test tray is brought into contact with the sockets of the (m×n) matrix on the HIFIX board 300 on the condition that the HIFIX board 300 having the sockets of the (m×n) matrix is matched with a test site of the handler 3, the conventional semiconductor test system can simultaneously test (m×n) semiconductor devices.

Also, the HIFIX board 300 may further include a DUT test unit for processing the read signal generated from the DUT, instead of the test header 200. The DUT test unit may be mounted to an additional PCB board independent of the above sockets, and may be implemented with an application specific integrated circuit or a field-programmable gate array (FPGA). In this case, the DUT test unit may make one pair with the driver 240 of the test header 200. Provided that 256 drivers may be contained in the test header 200, it is determined that the HIFIX board 300 also includes 256 DUT test units.

In more detail, the DUT test unit may include a plurality of pin electronic (PE) units 341 and 343, a plurality of digital comparators 331 and 333 corresponding to the individual PE units 341 and 343, a switch bundle (i.e., a bundle of switches) 320 for turning on or off a connection between the test header 200 and the pin electronic (PE) unit 341 or 343, and a switch driver 310 for driving the switch bundle upon receiving a control signal from the ALPG 220 of the test header 200.

In this case, the pin electronic (PE) unit 341 may include a HIFIX-side driver 341a for recording the pattern signal received from the test header 200 in the DUT, and a HIFIX-side comparator 341b for comparing the read signal generated from the DUT with a reference signal received from the reference voltage provider 230, and outputting the result of comparison between the read signal and the reference signal. In this way, the pin electronic (PE) unit 343 may include a HIFIX-side driver 343a and a HIFIX-side comparator 343b. The HIFIX-side digital comparator 331 or 333 determines whether or not there is a failure in the output signal of the HIFIX-side comparator 341b or 343b, and stores the determined result therein.

Operations of the semiconductor device test system according to the present invention will hereinafter be described in detail.

Firstly, if the semiconductor device test system records the test pattern signal generated from the ALPG 220 in the DUT, a switch in the switch bundle 320 for connecting the test header's driver 240 to the HIFIX-side driver 341a or 343a is switched on, and other switches of the switch bundle 320 are switched off. Also, the test header's ALPG 220 outputs a control signal for establishing a Write mode, such that it drives the HIFIX-side driver 341a or 343a and the test header's driver 240. The pattern signal generated from the test header's driver 240 is divided into a predetermined number of pattern signals as many as the number of the HIFIX-side drivers, such that the divided pattern signals are recorded in the corresponding DUT. Therefore, the number of simultaneously-recordable DUTs increases by the number of drivers constructing the DUT test unit in the HIFIX board 300.

Next, a method for processing the read signal generated from the DUT will hereinafter be described in detail. The test header's ALPG 220 outputs a control signal for establishing a Read mode, and stops driving the HIFIX-side driver 341a or 343a. In other words, the test header's ALPG 220 disables the HIFIX-side driver 341a or 343a, i.e., the ALPG 220 enters a Hi-Z status (i.e., a high impedance status), so that it prevents a collision between the Write mode and the Read mode. In this case, the test header's driver 240 keeps driving, such that the pattern signal generated from the test header's driver 240 can be used as one parameter when the HIFIX-side digital comparator 331 or 333 determines the presence or absence of a fail status.

Also, the HIFIX-side comparator 341b or 343b compares the read signal generated from the corresponding DUT with a reference signal (i.e., a reference voltage), and outputs the comparison resultant value. The HIFIX-side digital comparator 331 or 333 determines whether there is a failure in the output signal of the HIFIX comparator 341b or 343b, and stores the determined result. In this case, a memory (i.e., a flipflop) of the HIFIX-side digital comparator 331 or 333 stores a logic value '0' corresponding to the PASS status or the other logic value '1' corresponding to the FAIL status. If the logic value '1' is stored once, although the output signal of the HIFIX comparator 341a or 343b indicates the PASS status, the corresponding value (i.e., FAIL value) is maintained. In other words, as shown in FIG. 3, the digital comparator 331 or 333 sequentially performs XOR and OR logic operations, and stores the XOR- and OR-resultant values in the flipflop. If the logic value of '0' is stored in the flipflop by this operation process, this logic value of '0' is changed to the other logic value of '1'. If the logic value of '1' is stored once, this value of '1' is unchangeable. In this case, this flipflop is operated by a strobe (i.e., a clock signal) received from the test header's ALPG 220.

In this way, the semiconductor device test system repeatedly performs the above-mentioned semiconductor test process (i.e., the Read/Write process) several times, such that it completes a test for a corresponding DUT. Therefore, the number of input/output (I/O) channels is doubled by the number of pin electronic (PE) units of the DUT test unit, resulting in the increased number of DUTs capable of simultaneously performing the test without upgrading the test header 200.

In the meantime, after the test on the DUT is completed, the test header 200 reads the last value stored in the HIFIX-side flipflop. An associated detailed description will hereinafter be described in detail.

Firstly, the test header's ALPG 220 allows the driver 240 of the test header to enter the Hi-Z status. Then, the ALPG 220 controls the HIFIX-side switch driver 310, such that it connects a first HIFIX-side digital comparator 331 to the test header 200, and transmits a logic value received from the first HIFIX-side digital comparator 331 to the test controller 100.

Next, the ALPG 220 severs the connection to the first HIFIX-side digital comparator 331, and connects a second HIFIX-side digital comparator 333 to the test header 200, such that it transmits the logic value received from the second HIFIX-side digital comparator to the test controller 100.

Therefore, the test controller 100 controls the handler to classify DUTs loaded on the test tray according to their grades on the basis of the received logic value.

The scope and spirit of the semiconductor device test system according to the present invention are not limited to only the above-mentioned embodiments, but can also be modified in various ways within the range allowed by a technical idea of the present invention.

The invention claimed is:

1. A semiconductor device test system comprising:
   a test header which tests a semiconductor device by a test controller; and
   a high fidelity tester access fixture (HIFIX) board which establishes an electrical connection between the semiconductor device and the test header, and includes a Device Under Test (DUT) test unit which processes a read signal generated from the semiconductor device by making one pair with a driver of the test header and transmits the processed read signal to the test header,
   wherein the DUT test unit includes:
      a plurality of pin electronic (PE) units, each of which includes a HIFIX-side driver which records a pattern signal received from the test header in the semiconductor device, and a HIFIX-side comparator which compares the read signal generated from the semiconductor device with a reference signal received from the test header and outputs the result of comparison between the read signal and the reference signal;
      a plurality of digital comparators which correspond to the plurality of pin electronic (PE) units, respectively, determines whether or not there is a failure in the output signal of the HIFIX-side comparator and stores the determined result;
      a bundle of switches which turn on or off a connection between the test header and the plurality of pin electronic (PE) units; and
      a switch driver which drives the bundle of switches.

2. The semiconductor device test system according to claim 1, wherein the switch driver is controlled by the test header.

3. The semiconductor device test system according to claim 2, wherein the HIFIX-side driver is controlled by the test header.

4. The semiconductor device test system according to any one of claims 1, 2 and 3, wherein the DUT test unit is implemented with an application specific integrated circuit or a field-programmable gate array (FPGA).

* * * * *